Figure 1:
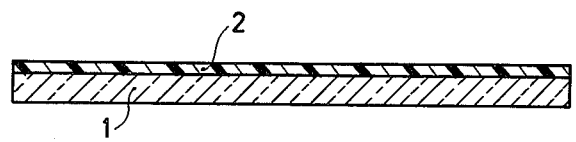

United States Patent [19]

Duinker et al.

[11] 3,965,278

[45] June 22, 1976

[54] METHOD OF MAKING SCREENS FOR CATHODE-RAY TUBES

[75] Inventors: Hans Dignus Duinker; Cornelis Johannes Schoot; Gerardus Antonius Wilhelmus Vermeulen, all of Eindhoven, Netherlands

[73] Assignee: U.S. Philips Corporation, New York, N.Y.

[22] Filed: Nov. 13, 1973

[21] Appl. No.: 415,367

[30] Foreign Application Priority Data

Nov. 30, 1972 Netherlands........................ 7216227

[52] U.S. Cl.................................... 427/54; 96/36.1; 156/13; 156/15; 313/466; 427/43; 427/68
[51] Int. Cl.².................... B05D 3/06; H01J 29/32
[58] Field of Search............. 117/33.5 CM; 96/36.1; 313/474, 466; 427/43, 64, 68, 54; 156/13, 15

[56] References Cited
UNITED STATES PATENTS

| | | | |
|---|---|---|---|
| 3,615,460 | 10/1971 | Lange.......................... | 117/33.5 CM |
| 3,615,462 | 10/1971 | Szegho......................... | 117/33.5 CM |
| 3,653,939 | 4/1972 | Prazak.......................... | 117/33.5 CM |
| 3,712,815 | 1/1973 | Rohrer et al. ............... | 117/33.5 CM |

*Primary Examiner*—John H. Newsome
*Attorney, Agent, or Firm*—Frank R. Trifari; Norman N. Spain

[57] ABSTRACT

In the manufacture of screens for cathode-ray tubes, a substantial part of the screens being covered with a non-reflecting substance, hardened polyvinyl alcohol dots of relatively small diameter should be obtained by exposure via a mask with relatively large holes. Owing to an inadequate gradient of the photosensitive polyvinyl alcohol it is not possible to obtain dots of uniform size. The invention enables well-defined, uniform dots to be obtained by superposing a substance on the photosensitive layer which absorbs the light used during exposure, thereby decomposing into substances which do not or not substantially absorb this light. Thus, the effective gradient of the photosensitive polyvinyl alcohol is increased.

5 Claims, 14 Drawing Figures

METHOD OF MAKING SCREENS FOR CATHODE-RAY TUBES

The invention relates to a method of making picture screens for cathode-ray tubes, in which the face plate is coated with a photosensitive layer, which contains polyvinyl alcohol and a hexavalent chrominium compound, after which the photosensitive layer is locally hardened by exposure via a mask, the image is developed with an aqueous liquid and subsequently dried, upon which the faceplate is coated with a non-reflecting layer, the hardened polyvinyl alcohol is etched away and the resulting, uncovered parts of the faceplate are coated with a substance which luminesces under electron impact.

The fact that screens of cathode-ray tubes reflect incident light is found to be disturbing. Therefore, it has been proposed to coat those parts of the faceplate which are not covered by a substance which luminesces under electron impact with a non-reflecting substance (Netherlands Patent Application 6,804,370 published Sept. 30, 1968).

The pigment dots on the faceplate usually have a substantially greater diameter than the portions of the electron beams passed by the mask, by which they should be hit. As a result, the chance of a dot being hit is great.

In order to be able to cover an as large as possible part of a faceplate with a non-reflecting substance, the pigment dots should be as small as possible. To increase the chance of hitting, the transmitted portions of the electron beams should be given a diameter which is greater than the diameter of the pigment dots.

As the mask which is used to obtain the pattern of pigment dots by exposure of a photosensitive layer on the faceplate is the same as that incorporated in the cathode-ray tube, provisions should be made to assure that the light beam which passes the mask during manufacture of the screen produces a pigment dot of small diameter, whilst the portions of the electron beams which pass the mask in the finished tube have a greater diameter.

This can be achieved by initially using a mask with small holes and after the formation of the dot pattern enlarging the holes in the mask by etching.

However, an alternative solution was found in which a pattern of dots of small diameter is produced upon exposure via a mask with large holes. This effect can be achieved by an exposure method as described in the Journal of the Society of Motion Picture and Television Engineers 65 407–410 (1956).

The effect of the exposure is a pattern of dots which consist of a core of hardened polyvinyl alcohol (p.v.a.) surrounded by a zone of partially hardened p.v.a. in a matrix of unhardened p.v.a.

During development subsequent to the exposure the matrix is washed away and the cores and zones are not.

The formation of the zones has two causes: on the one hand the luminous intensity on the photosensitive layer during exposure only gradually decreases from high in the center behind a mask hole to low at some distance from the centre, on the other hand the photosensitive layer requires a high luminous intensity in order to be hardened — such as in the centre behind a mask hole —, whereas a lower luminous intensity suffices for said layer to be hardened to some extent as at some distance from the centre. In other words, the photosensitive layer has a moderate gradient.

It is an object of the invention to increase the effective gradient of the photosensitive layer and thus the hardening gradient at the edge of the p.v.a. dots, in order to ensure that the p.v.a. dots have a greater uniformity.

According to the invention this is achieved by superimposing on the photosensitive layer a substance which absorbs the light used for the exposure, and decomposes into substances which do not or not substantially absorb this light.

The result of this step is that at the beginning of the exposure at all the exposed points only an (equal) fraction (for example 5%) of the incident light penetrates into the photosensitive p.v.a. layer and can produce hardening. At points with a high luminous intensity more molecules of the light absorbing substance are decomposed than at points with a low luminous intensity. At said first points a substantially greater fraction (eventually approx. 90%) of the incident light penetrates the photosensitive p.v.a. layer.

Accordingly, the invention relates to a method of making screens for cathode-ray tubes, in which the faceplate is coated with a photosensitive layer, which contains polyvinyl alcohol and a hexavalent chromium compound, after which the photosensitive layer is locally hardened by exposure via a mask, the image is developed and subsequently dried, upon which the faceplate is coated with a non-reflecting layer, the hardened polyvinyl alcohol is etched away and the resultant uncoated parts of the faceplate are coated with a substance which luminesces under electron impact, characterized in that in the photosensitive layer is coated with a substance which absorbs the light used for exposure, thereby decomposing into substances which do not or not substantially absorb this light.

Compounds of hexavalent chromium have a maximum photosensitivity at 365 m$\mu$. Therefore, radiation of a wavelength of 365 m$\mu$ is an essential component of the light used for exposure.

The light-absorbing substances which decompose under the influence of light should therefore preferably exhibit maximum absorption at approximately 365 m$\mu$, their decomposition products not or not substantially absorbing said wavelength.

Numerous known compounds exhibit these properties, for example:

a. phenyl diazo compounds, such as diazo compounds of the formula 1,

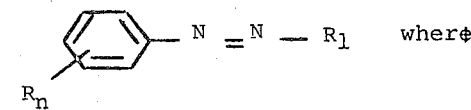

where $R_1$ represents a nitrile group, a tertiary butylthio group or an $SO_3M$ group, where M represents hydrogen, sodium, potassium, lithium, ½ cadmium, tetramethyl ammonium, tetraethyl ammonium or pyridinium, n has the value 0, 1, 2 or 3, and R represents an alkyl or alkoxy group, a dimethyl amino group, a halogen atom, a benzoyl group or a morpholino group.

Examples of compounds of this group are p-methoxy benzene diazo-sodium sulphonate, p-methoxybenzene-diazosulphonic acid, p-morpholino-m-chlorobenzene diazocyanide, p-chloro-o-methyl-benzene-diazotert. butyl sulphide.

b. 1,3-diphenyl triazenes, such as those of the formula 2,

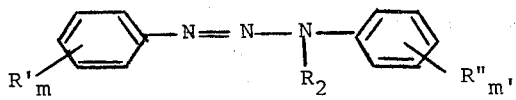

where R' and R'' represent an alkyl, alkoxy or benzoyl group or a halogen atom, m and m' have the value 0, 1, 2 or 3 and $R_2$ represents hydrogen or a methyl group.

Examples of these compounds are: 1,3-diphenyl triazene, 1,3-di(p-tolyl)triazene, 1-(2,5-dichlorophenyl)-3-(o-chlorophenyl)triazene, 1,3-di(p-tolyl)-3-methyl-triazene, 1-(p-benzoyl phenyl) -3-(m-chlorophenyl)-3-methyltriazene.

c. diazonium salts, such as those of the formula 3,

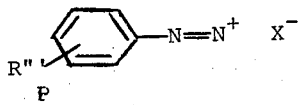

where R''' is an alkyl, alkoxy, dialkylamino, (alkylhydroxyalkyl)amino, phenylamino or morpholino group, $X^-$ is an anion, for example the chloride ion, and p has the value 0, 1, 2 or 3, and double salts formed with these compounds.

Examples of compounds of this group are: p-(ethyl-2-hydroxyethylamino) benzene diazonium chloride zinc-chloride, p-dimethylamino benzene diazonium chloride zinc-chloride, p-dimethylamino benzene diazonium borotetrafluoride, 2,5-dimethoxy-4-morpholino benzene diazonium chloride.

d. esters of naphthoquinone — (1,2)-diazido-(2)-sulphonic acid and carboxylic acid, such as for example those described in German Patent Specifications 854,890; 865,109; 938,233; 1,109,521; 1,114,705; 1,118,606; 1,120,273; the "Auslegeschrift" 1,195,166 and United States Patent Specification 3,402,044.

It is to be noted that in the manufacture of cathoderay tube screens it is known to use photoresists consisting of polyvinyl alcohol and bichromate, in which a transparent substance which becomes opaque upon exposure is homogeneously distributed. The purpose of this is to enable a thicker coating of better definition to be obtained.

It is obvious that if the light absorbing substances, which according to the invention are superposed on the photosensitive layer, were homogeneously distributed in the said layer, no increase of the gradient of the photosensitive layer would be obtained. On the contrary, the p.v.a. would be hardened at the surface at those points where light of low intensity impinges but would not harden in the deeper layers and at the screen surface. As a matter of fact, the definition of the image obtained after exposure and development would even be deteriorated.

The light absorbing substances on the photosensitive layer are applied as a solution in an inert organic solvent. After evaporation of the solvent, which may be accelerated by heating, for example with the aid of infrared lamps, by passing over a gas stream or by means of reduced pressure, exposure takes place. Subsequently, the residual amount of light absorbing substance, as well as its decomposition products, are removed by dissolving these in a solvent. The latent image is subsequently developed.

Hydrocarbons such as for example toluene, styrene, ketones such as acetone and cyclopentanone, ethers such as dioxane and di-ethyl ether, esters such as ethyl acetate, methoxyethyl acetate etc., may be used as solvents.

If water-soluble substances are employed, such as diazo compounds and diazonium compounds, it is advisable to separate the photosensitive layer and the light absorbing substance by an inert layer. This prevents the light absorbing substance from diffusing in the photosensitive layer, which would reduce the effect of using the substance.

Film-forming polymer compounds which are soluble in organic solvents and polymer compounds which are insoluble in water may be used for the formation of such an inert layer. Polymethylmethacrylate, applied as a solution in for example turpentine or toluene, as well as nitrocellulose in for example butyl acetate, have proved to be extremely suitable.

As polyvinyl alcohol the usual commercial products with a degree of saponification of approximately 88% may be used. The average molecular weight is preferably approximately 100,000.

As hexavalent chromium compounds alkali bichromates, ammonium bichromate, tetra-alkyl ammonium bichromates, tri-alkyl aralkyl ammonium bichromates and the like may be employed.

Furthermore, other usual substances may be added to the photosensitive layer, such as dipolar aprotic substances, such as dimethyl sulphoxide, N-methyl-α-pyrrolidone, γ-butyrolacetone, ethylene glycol carbonate, sulpholane, dimethyl-acetamide, dimethylformamide, hexamethylphosphoramide and tetramethylurea, and low volatile bases, such as tetraalkyl ammonium hydroxide.

The latent image obtained after exposure is developed by water. However, it is also possible to use a solution of the sensitizer and after development, fixing and drying, to treat the screen thermally or to expose it again so as to further harden the p.v.a., if desired.

If desired, the development of the image may be followed in a known manner by treatment with acetone in order to fix the developed image.

The screens which are provided with well defined p.v.a. dots according to the invention, can be further processed to display screens by means of conventional techniques.

EXAMPLES a. A glass faceplate for a screen was coated with a layer of a solution of polyvinyl alcohol having an average molecular weight of approximately 100,000 and a degree of hydrolysis of approximately 88% (Rhodoviol 50/125 M (R)) (3.5% by weight) and ammonium bichromate (0.115% by weight) in water. The layer was dried by heating by means of infrared lamps and by passing a stream of dry air over it. Subsequently a solution of 650 g of polymethyl methacrylate in 5 l of toluene was sprayed onto the polyvinyl alcohol/bichromate layer, after which the solvent was removed by heating with infrared lamps. The screen was then sprayed with a solution of 3.5% by weight of the previously used polyvinyl alcohol and 0.35% by weight of p-(N-ethyl, N-hydroxyethylamino) benzene diazonium zinc-chloride. After the layer had dried it was exposed via a mask by a 900 W high-pressure mercury lamp. After this the polymethyl methacrylate layer the diazonium compound and the decomposition products thereof present on this layer were washed away by means of toluene. The latent image in the p.v.a. bichromate layer was developed by spraying the screen with water for 1½ min. (Spraying pressure 0.3 atm). From the last second of development the screen was sprayed with acetone for 5 seconds (spraying pressure 0.2 atm.). Subsequently the screen was dried by heating it with infrared lamps and passing a stream of dry air over it, the p.v.a. dots hardening through thermally. The dot pattern obtained consisted of uniform, smoothly bounded dots.

b. Subsequently the screen was covered with a graphite suspension consisting of 1125 grammes of graphite, approximately 4500 ml of deionized water, 30 ml of ethylene glycol, 2 ml of a wetting agent, for example "Dispergent L 77" of Union Carbide, and 0.25 ml of dispersing agent, for example Acrysol G 110 65%, a suspension of 65% by weight of acrylate resin in water. The layer was dried by means of infra-red lamps. Subsequently, the p.v.a. dots were etched away with a solution of 3% by weight of hydrogen peroxide. (When the method was repeated a solution of 1% by weight of potassium permanganate was used instead of a hydrogen peroxide solution). Then the screen was washed with water.

After drying a graphite-coated screen with a pattern of well-defined round holes was obtained. Subsequently, the screen was processed to a finished display screen by treatment with a photoresist containing a substance which luminesces under electron impact, by drying, exposure, development and repeating these treatments with substances which luminesce under electron impact in different colour.

The method according to the invention is illustrated in outline by means of the FIGS. 1 to 12, which represent a cross-sectional view through a glass plate 1.

In FIG. 1 the glass plate is coated with a photosensitive layer 2 containing polyvinylalcohol and a sensitizer.

Figure 2:
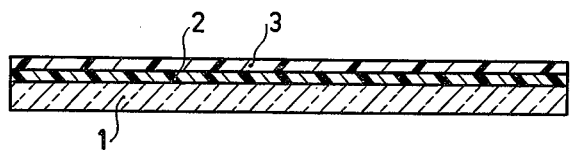

In FIG. 2 the photosensitive layer 2 is coated with a substance 3 which absorbs light and in doing so decpomposes to compounds not absorbing light. The photosensitive layer is locally hardened by exposure through a mask.

Figure 3:
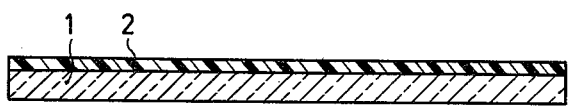

In FIG. 3 the light absorbing substance 3 and its decomposition products are washed away.

Figure 4:
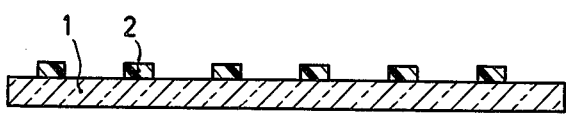

In FIG. 4 the photosensitive layer is developed.

Figure 5:

In FIG. 5 a non-reflecting layer 4 is applied.

Figure 6:
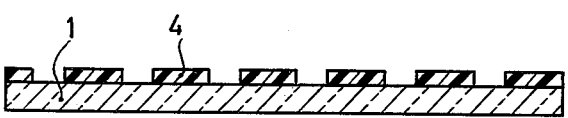

In FIG. 6 the hardened polyvinyl alcohol is removed by etching.

Figure 7:
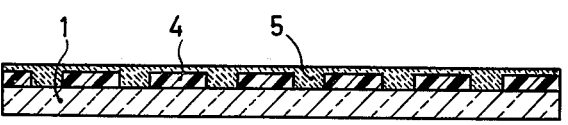

In FIG. 7 a photosensitive layer containing a first electron exitable luminescent material (e.g. red luminescent material) is represented by 5.

Figure 8:
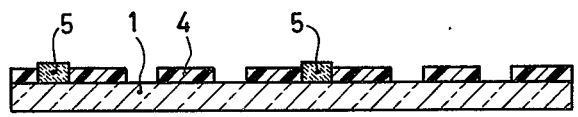

In FIG. 8 the photosensitive layer 5 has been locally hardened by exposure through a mask and developed.

Figure 9:
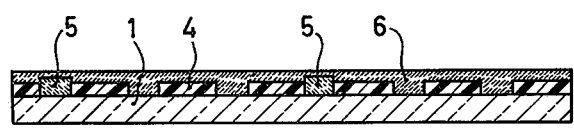

In FIG. 9 a photosensitive layer containing a second electron excitable luminescent material (e.g. blue luminescent material) is represented by 6.

Figure 10:
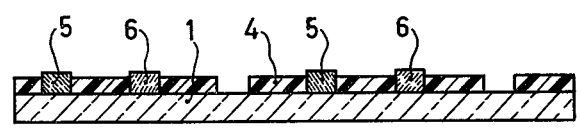

In FIG. 10 the photosensitive layer 6 has been locally hardened by exposure through a mask and developed.

Figure 11:
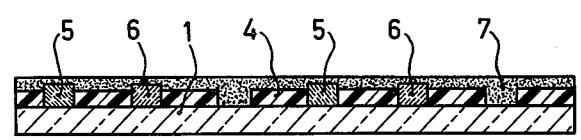

In FIG. 11 7 represents a photosensitive layer containing a third electron excitable luminescent material (green luminescent).

Figure 12:

In FIG. 12 the photosensitive layer 7 has been locally hardened by exposure through a mask and developed.

Figure 2A:
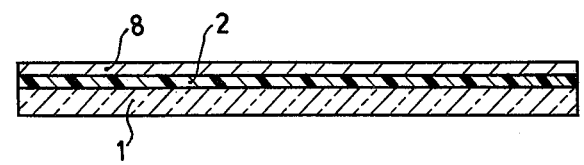
Figure 2B:
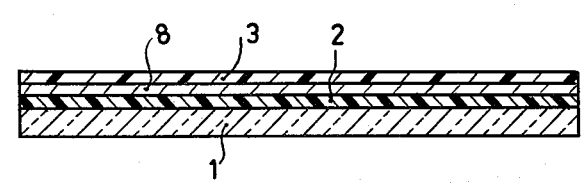

In a modification of the method, after the step represented in FIG. 1, the photosensitive layer 2 is coated with an inert layer 8 as shown in FIG. 2a after which a layer 3 is applied of a substance which absorbs light and in doing so decomposed to compounds not absorbing light (FIG. 2b). The photosensitive layer is then hardened by exposure through a mask.

FIG. 3 shows that the light absorbing substance 3 and its decomposition products as well as the inert layer 8 are washed away.

The other steps of the modified method are illustrated by FIGS. 4 to 12.

What is claimed is:

1. A method of providing a screen on a cathode-ray tube suitable for the application of phosphor materials, said method comprising forming a light-hardenable photosensitive layer of polyvinyl alcohol and a light-sensitive hexavalent chromium compound on a face plate of said tube, forming a layer of polyvinyl alcohol and a light-sensitive substance capable of absorbing light and which upon exposure to light decomposes into decomposition products which substantially do not absorb said light on said light hardenable photosensitive layer, locally exposing said thus coated face plate to light through a mask to locally harden desired areas of said light hardenable layer, dissolving out by means of a suitable solvent the light sensitive compound and the decomposition products thereof, developing the latent image produced by exposure to light of the polyvinyl alcohol-chromium compound layer, drying said developed image, thereby producing a layer of sharply defined hardened portions of polyvinyl alcohol on said face plate, applying a non-reflective layer to said face plate and then etching away the hardened polyvinyl alcohol portions and the portions of the non-reflective layer superimposed thereon thereby leaving sharply defined uncoated portions of the face plate separated from each other by the non-reflective layer and suitable for coating by phosphors.

2. The method of claim 1 wherein the light absorbing substance have a maximum absorption at approximately 365 mμ.

3. The method of claim 2 where the light-absorbing substance is an aromatic nitrogen compound selected from the group consisting of compounds of the formula:

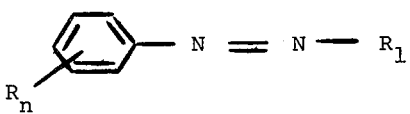

wherein $R_1$ is a moiety selected from the group consisting of nitrile, tertiary butylthio and $SO_3M$ where $R_1$ is a member selected from the group consisting of hydrogen, sodium, potassium, lithium, ½ cadmium, tetramethyl ammonium, tetraethyl ammonium and pyridinium, R is a moiety selected from the group consisting of alkyl, alkoxy, dimethylamino, halogen, benzoyl, and morpholino and n has a value of 0, 1, 2 or 3; compounds of the formula:

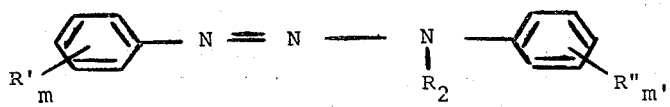

wherein R' and R'' are moieties selected from the group consisting of alkyl, alkoxy, benzoyl and halogen and $R_2$ is a moiety selected from the group consisting of hydrogen and methyl and $m$ and $m'$ have the value of 0, 1, 2 or 3; and compounds of the formula:

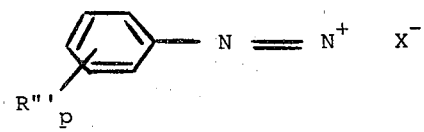

wherein R''' is a moiety selected from the group consisting of alkyl, alkoxy, dialkylamino, alkyl-hydroxyalkyl amino, phenylamino and morpholino, X- is an anion and p has the value of 0, 1, 2 or 3.

4. The method of claim 3 wherein a layer of an inert-water soluble material is interposed between the light hardenable layer of polyvinyl alcohol and the layer containing the light absorbing substance.

5. A screen on a cathode ray tube manufactured by the method of claim 1.

* * * * *